United States Patent
Nakayama et al.

(10) Patent No.: US 8,987,762 B2
(45) Date of Patent: Mar. 24, 2015

(54) SEMICONDUCTOR LIGHT-EMITTING DEVICE AND MANUFACTURING METHOD OF THE SAME

(75) Inventors: Toshiya Nakayama, Kanagawa-ken (JP); Kazuhito Higuchi, Kanagawa-ken (JP); Hiroshi Koizumi, Kanagawa-ken (JP); Hideo Nishiuchi, Hyogo-ken (JP); Susumu Obata, Kanagawa-ken (JP); Akiya Kimura, Kanagawa-ken (JP); Yoshiaki Sugizaki, Kanagawa-ken (JP); Akihiro Kojima, Kanagawa-ken (JP); Yosuke Akimoto, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/607,480

(22) Filed: Sep. 7, 2012

(65) Prior Publication Data
US 2013/0082294 A1 Apr. 4, 2013

(30) Foreign Application Priority Data
Sep. 30, 2011 (JP) ................... 2011-218756
Mar. 29, 2012 (JP) ................... 2012-078364

(51) Int. Cl.
*H01L 33/50* (2010.01)
*H01L 33/56* (2010.01)
*H01L 33/54* (2010.01)

(52) U.S. Cl.
CPC .............. *H01L 33/56* (2013.01); *H01L 33/508* (2013.01); *H01L 33/54* (2013.01); *H01L 33/502* (2013.01)
USPC .................. 257/98; 257/88; 257/91; 257/100

(58) Field of Classification Search
CPC ......... H01L 33/00; H01L 33/50; H01L 33/52; H01L 33/54; H01L 33/56; H01L 33/505; H01L 33/507; H01L 33/508; H01L 2933/041; H01L 27/15; H01L 27/156
USPC .................................... 257/79–100
See application file for complete search history.

(56) References Cited

U.S. PATENT DOCUMENTS

| 7,737,463 | B2 * | 6/2010 | Lee et al. | 257/99 |
| 7,859,001 | B2 * | 12/2010 | Niino et al. | 257/98 |
| 2005/0263775 | A1 * | 12/2005 | Ikeda et al. | 257/79 |
| 2008/0023721 | A1 | 1/2008 | Lee et al. | |
| 2009/0123764 | A1 | 5/2009 | Morita et al. | |

(Continued)

FOREIGN PATENT DOCUMENTS

| JP | 2003-046134 | 2/2003 |
| JP | 2009-117833 A | 5/2009 |

(Continued)

OTHER PUBLICATIONS

Korean Intellectual Property Office Notice of Preliminary Rejection; Korean Patent Application No. 10-2012-101367; Mailed Nov. 14, 2013 (with English translation).

*Primary Examiner* — Tom Thomas
*Assistant Examiner* — John Bodnar
(74) *Attorney, Agent, or Firm* — Patterson & Sheridan, LLP (57) ABSTRACT

According to one embodiment, a light-emitting unit which emits light, a wavelength conversion unit which includes a phosphor and which is provided on a main surface of the light-emitting unit, and a transparent resin which is provided on top of the wavelength conversion unit, are prepared. The transparent resin has a greater modulus of elasticity and/or a higher Shore hardness than the wavelength conversion unit.

8 Claims, 7 Drawing Sheets

(56) References Cited

U.S. PATENT DOCUMENTS

| | | | |
|---|---|---|---|
| 2009/0212305 A1* | 8/2009 | Harada | 257/88 |
| 2010/0133574 A1* | 6/2010 | Thompson et al. | 257/98 |
| 2010/0142182 A1* | 6/2010 | Van Woudenberg et al. | 362/84 |

FOREIGN PATENT DOCUMENTS

| | | |
|---|---|---|
| JP | 2010-157637 | 7/2010 |
| KR | 10-0709890 B1 | 4/2007 |
| KR | 2009-0008339 A | 1/2009 |

* cited by examiner

SEMICONDUCTOR LIGHT-EMITTING DEVICE AND MANUFACTURING METHOD OF THE SAME

CROSS-REFERENCE TO RELATED APPLICATION

This application is based upon and claims the benefit of priority from Japanese Patent Application No. 2011-218756, filed Sep. 30, 2011 and Japanese Patent Application No. 2012-078364, filed Mar. 29, 2012; the entire contents of which are incorporated herein by reference.

FIELD

Embodiments described herein relate to a semiconductor light-emitting device and a manufacturing method of the same.

BACKGROUND

In one example, of a semiconductor light-emitting device has a semiconductor element (hereinafter, simply referred to as light-emitting element), a wavelength conversion unit including a phosphor, a light-emitting element which, for example, emits blue light (such as a Blue LED (Light Emitting Diode)) and phosphor that emits, for example, yellow light that is complementary to the blue light. These components are employed together in order to obtain a white light. Other phosphors emitting other wavelengths (i.e., colors) of light may also be combined in a wavelength conversion unit in this manner to obtain other colors via the combined wavelengths.

When manufacturing this kind of semiconductor light-emitting device, the surface of the wavelength conversion unit may be smoothed by a polishing process and then subjected to a wet etching technique that creates a roughened, irregular surface thereon.

These conventional semiconductor light-emitting devices are typically mounted on a substrate using a robotic device (e.g., a chip mounter) that utilizes vacuum adsorption, which facilitates pick up and transfer of the semiconductor light-emitting device in the mounting process. However at this stage, as the surface of the wavelength conversion unit is roughened by etching, air can undesirably enter the surface via gaps in the irregular surface. When this happens, the robotic device will fail to pick up and/or reliably transfer the semiconductor light-emitting device. The resulting pick up failures cause a yield reduction.

DESCRIPTION OF THE DRAWINGS

FIG. 1 is a figure showing the semiconductor light-emitting device according to one embodiment.

DETAILED DESCRIPTION

In general, the embodiments will be explained by referring to the drawings that follow. It should be noted that common reference numerals are utilized in the FIGS denoting similar elements, and detailed descriptions of the similar elements will be omitted, as appropriate, for the sake of brevity.

Here, according to one embodiment, there is provided a semiconductor light-emitting device and a manufacturing method thereof which will enable yield improvement.

In order to achieve higher yield, the semiconductor light-emitting device according to this embodiment comprises a light-emitting unit, a main surface of the light-emitting unit, a wavelength conversion unit, which includes phosphor, and which is mounted on the main surface, and a transparent resin on top of the wavelength conversion unit. The transparent resin has a greater modulus of elasticity and/or a higher Shore hardness than the wavelength conversion unit.

The manufacturing method of the semiconductor light-emitting device according to this embodiment enables production of a device with a light-emitting unit, a wavelength conversion unit, which contains phosphor, and which is disposed on a main surface of the light-emitting unit, and a transparent resin disposed on top of the wavelength conversion unit. The manufacturing method of the semiconductor light-emitting device includes a process involving forming the wavelength conversion unit on a main surface of the light-emitting unit, and a process of forming the transparent resin on top of the wavelength conversion unit, so as to have a greater modulus of elasticity and/or a higher Shore hardness than the wavelength conversion unit.

Here a semiconductor light-emitting device with multiple emitting units (i.e., a multi-chip type semiconductor light-emitting device) is illustrated as an example.

Figure 1:
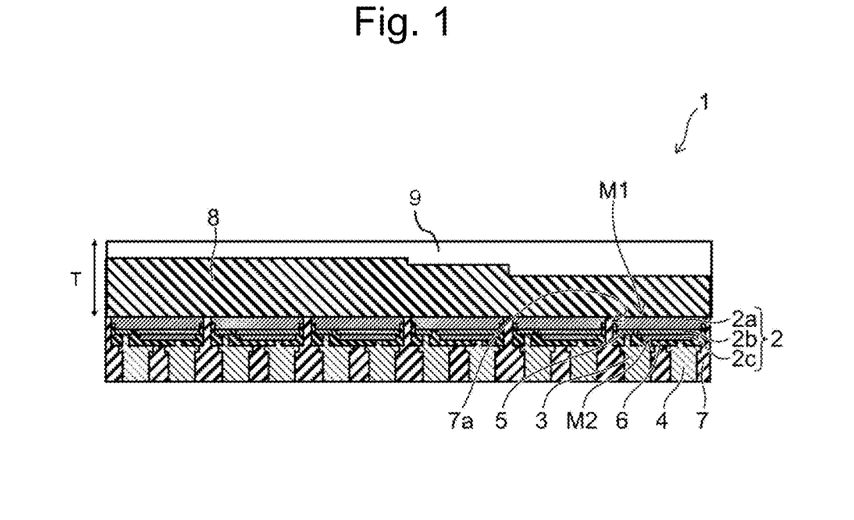
FIG. 1 is a schematic cross-sectional view of a semiconductor light-emitting device.

FIG. 1 is a cross-sectional diagram that illustrates the semiconductor light-emitting device 1 that has been fabricated according to embodiments disclosed herein. As shown in FIG. 1, in the semiconductor light-emitting device 1, a light-emitting unit 2, an electrode part 3, an electrode part 4, a junction 5, a wiring part 6, a sealing part 7 and a wavelength conversion unit 8, are provided. The light-emitting unit 2 comprises multiple light-emitting sub-units, which, when taken together, comprise the light-emitting unit 2. While the semiconductor light-emitting device 1 may include a plurality of the light emitting units 2, only a single light emitting unit 2 will be described in detail herein.

The light-emitting unit 2 includes a main surface M1 and a main surface M2. Main surface M2 is opposite the main surface M1. In each of the light-emitting sub-units 2, a semiconductor part 2a, an active part 2b, and a semiconductor part 2c are provided.

The semiconductor part 2a can be formed by using an n-type nitride semiconductor such as GaN (gallium nitride), AlN (aluminum nitride), AlGaN (aluminum gallium nitride) and InGaN (indium gallium nitride), etc.

The active part 2b is provided between the semiconductor part 2a and the semiconductor part 2c. The active part 2b can have a quantum well structure composed of a well layer which emits light by recombining holes and electrons. The active part 2b also includes a barrier layer (cladding layer) which includes a band gap which is greater than the band gap of the well layer. However, the structure of active part 2b is not limited to the quantum well structure. It is possible to appropriately select an alternative structure which is capable of emitting light.

The semiconductor part 2c can be formed of a p-type nitride semiconductor such as GaN, AlN, AlGaN and InGaN, etc.

The light-emitting unit 2 may be a light-emitting diode for which the peak light-emitting wavelength is within the 350 nm-600 nm range, or other component with similar characteristics.

An electrode part 3 and an electrode part 4 are disposed between the bottom of a trench 7a and an edge sealing part 7. An edge of the electrode part 3 is electrically connected to a junction 5 and at the junction 5, the electrode part 3 and the semiconductor part 2a are electrically connected to each other. Also, an edge of the electrode part 4 is electrically connected to the semiconductor part 2c.

The junction 5 is formed between the electrode part 3 and the semiconductor part 2a. The junction 5 can be formed of metal material such as Cu (copper), etc. The junction 5 is not necessarily required in accordance with the embodiments of this disclosure. However, it may be advantageous to include, depending on the purpose for which the embodiment is to serve.

An insulating part 6 is provided so as to embed the trench 7a which is provided by sealing part 7. The insulating part 6 can be formed from an inorganic material such as $SiO_2$, resins, etc.

The edge sealing part 7 is provided on the main surface M2 of the light-emitting unit 2, while exposed to the edge of the electrode part 3 and the edge of the electrode part 4. The sealing part 7 also seals the electrode part 3 and the electrode part 4. The edge sealing part 7 has a trench 7a, and serves to seal the light-emitting unit 2 which is disposed in the trench 7a and the junction 5. It should be noted that the sealing part 7 and the insulating part 6 can form an integrated structure.

A wavelength conversion unit 8 is provided on the main surface M1 of the light-emitting unit 2. The wavelength conversion unit 8 contains phosphor which will be explained later. Also, the wavelength conversion unit 8 has a distribution of the amount of phosphor which can be determined based on the light emitting characteristics (e.g., wavelengths) of light-emitting unit 2 which is determined during manufacture of the semiconductor light-emitting device 1. The details of the distribution of the amount of phosphor will be described later.

The wavelength conversion unit 8 can be formed by using resin which is mixed with the phosphor. The phosphor is the material capable of providing wavelength conversion. In addition, it is preferable that the wavelength conversion unit 8 is formed so as to have a modulus of elasticity of 80-1000 mega Pascals (MPa) and a hardness of 5-90 on the Shore D hardness scale.

The wavelength conversion unit 8 can include at least one phosphor which has a peak light-emitting wavelength of 440 nm-470 nm for blue light, 500 nm-555 nm for green light, 560 nm-580 nm for yellow light, and more than 600 nm-670 nm for red light. The wavelength conversion unit 8 includes a phosphor with a bandwidth of light-emitting wavelength of 380 nm-720 nm.

At least one of the phosphor materials is silicon (Si), aluminum (Al), titanium (Ti), germanium (Ge), phosphorus (P), boron (B), yttrium (Y), an alkaline earth element, sulfide element, rare earth element or a nitride element.

As for materials of a phosphor that emits a red fluorescence, either of the following materials can be used. However, other phosphors that emit red fluorescence can alternatively be used as appropriate.

$La_2O_2S$: Eu, Sm,
$LaSi_3N_5$: $Eu^{2+}$,
α-sialon: $Eu^{2+}$,
$CaAlSiN_3$: $Eu^{2+}$,
$(SrCa) AlSiN_3$: $EuX+$,
$Sr_x (Si_yAl_3) z (O \times N)$: $EuX+$ The phosphors that emit green fluorescence can be selected from the following list of materials. However there are other phosphors that emit green fluorescence and which can be used as appropriate alternatives. The following list of example materials is by no means comprehensive.

$(Ba, Sr, Mg) O.aAl_2O_3$: Mn,
$(BrSr) SiO_4$: Eu,
α-sialon: $Yb^{2+}$,
β-sialon: $Eu^{2+}$,
$(CaSr) Si_2O_4N_7$: $Eu^{2+}$,
$Sr (SiAl) (ON)$: Ce The phosphors which emit blue fluorescence can be selected from the following list of materials, for example. However, the phosphors which emit blue fluorescence can alternatively be selected from amongst other additional materials, as appropriate. The following list is by no means comprehensive.

ZnS: Ag, Cu, Ga, Cl,
$(Ba, Eu) MgAl_{10}O_{17}$,
$(Ba, Sr, Eu) (Mg, Mn) Al_{10}O_{17}$,
$10 (Sr, Ca, Ba, Eu).6PO_4.Cl_2$,
$BaMg_2Al_{16}O_{25}$: Eu
$Y_3 (Al, Ga) 5O_{12}$: Ce
$SrSi_2ON_{2.7}$: $Eu^{2+}$

The phosphors which emit yellow fluorescence can be selected from the following list of example materials. However, the phosphors which emit yellow fluorescence can alternatively be selected from amongst other additional materials, as appropriate. The following list is by no means comprehensive.

$Li (Eu, Sm) W_2O_8$,
$(Y, Gd) 3, (Al, Ga) 5O_{12}$: $Ce^{3+}$,
$Li_2SrSiO_4$: $Eu^{2+}$,
$(Sr (Ca, Ba)) 3SiO_5$: $Eu^{2+}$,
$SrSi_2ON_{2.7}$: $Eu^{2+}$

The phosphors which emit yellowish-green fluorescence can be selected from the following list of example materials. However, the phosphors which emit yellowish-green fluorescence can alternatively be selected from amongst other additional materials, as appropriate. The following list is by no means comprehensive.

$SrSi_2ON_{2.7}$: $Eu^{2+}$

In accordance with this embodiment, multiple types of phosphors may be used in mixtures. In this case, it is possible to change the mixing ratio of multiple types of phosphor in order to change the shade of the colors. For example, by changing the shade in this way it may be possible to emit a bluish white light or yellowish white light, etc.

The resin mixed in with the phosphor may be epoxy resin, silicone resin, methacrylic resin (PMMA), polycarbonate (PC), cyclic polyolefin (COP), alicyclic acrylic (OZ), allyl diglycol carbonate (ADC), acrylic resin, fluorine resin, a hybrid resin from silicon resin and epoxy resin, or urethane resin, or another similar and suitable resin.

The light-emitting unit 2 can be formed by using the epitaxial growth method. However, when that method is used there may be a variation in the thickness of the light-emitting part 2 during the formation process. If there is a variation in the thickness of the light-emitting unit 2, there will also be a variation in the wavelength of the light emitted from the light-emitting unit 2. And, if there is a variation in the wavelength of the light emitted from the light-emitting unit 2, there will be a corresponding variation in the chromaticity as well.

Figure 2:
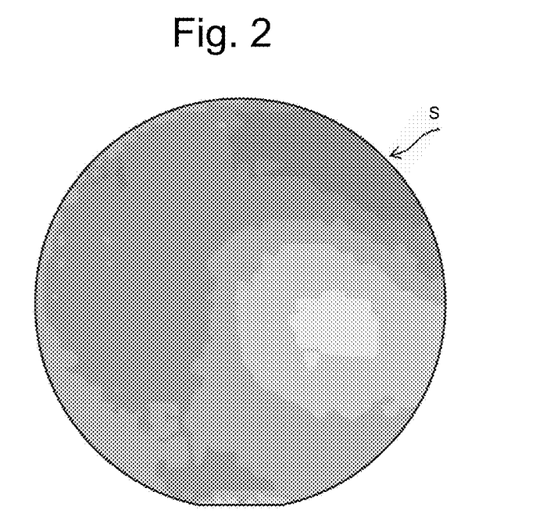
FIG. 2 is a schematic diagram showing the distribution of wavelengths of the light emitted by multiple light-emitting units formed on a substrate.

FIG. 2 is a schematic diagram that shows the distribution of the wavelengths of the light emitted by multiple light-emitting units formed on a substrate S. It should be noted that the wavelength distribution of the light emitted from the multiple light-emitting units formed on the substrate S is represented by shades of black and white color. The shorter the wavelength is, the darker it appears in the figure. The longer the wavelength is the lighter it appears in the figure.

As shown in FIG. 2, there may be a variation in wavelength of the light emitted by the light-emitting unit at different positions on the substrate S. This means there is a variation in wavelength of the light emitted by the light-emitting unit 2.

Here, if there is a variation in wavelength of the light, the variation in chromaticity increases. The wavelength conversion unit 8 is provided in order to vary the thickness dimension of the light-emitting unit 2 based on the variation of the wavelength of the light emitted from the light-emitting unit 2. More precisely, the wavelength conversion unit 8 is provided having the distribution amount of the phosphor based on the information related to the light emitted from the light-emitting unit 2.

Figure 3A:
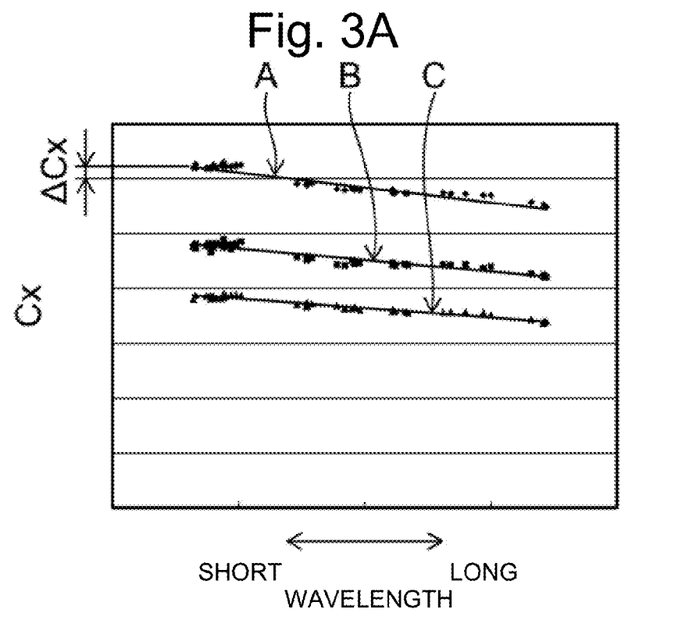
FIGS. 3A and 3B are schematic graphs illustrating the relationship between wavelength and chromaticity.
Figure 3B:
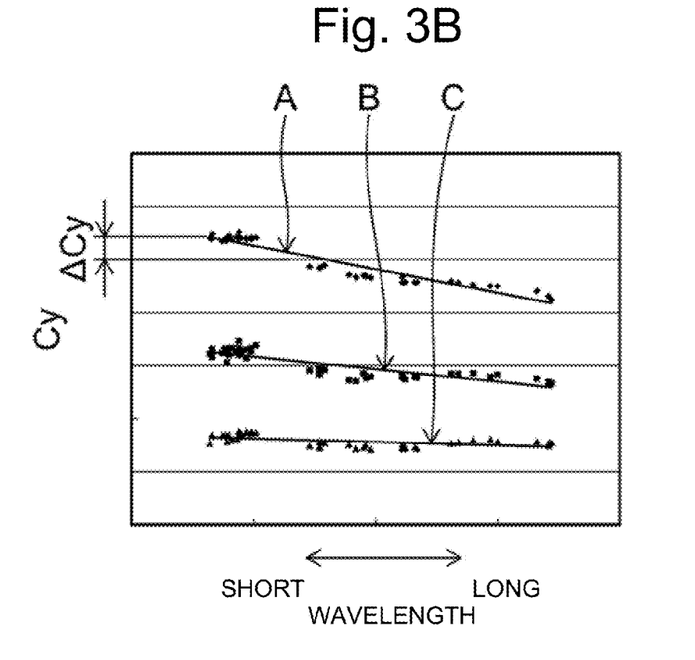

Next, the relationship between the thickness dimension of the wavelength conversion unit 8 and the variation in chromaticity of emitted light will be illustrated. FIGS. 3A and 3B are graphs illustrating the relationship between the wavelength and the chromaticity of emitted light. It should be noted that FIG. 3A is a schematic graph illustrating the relationship between the wavelength and the X coordinate value Cx in the chromaticity diagram, and FIG. 3B is a schematic graph illustrating the relationship between the wavelength and the Y coordinate value Cy in the chromaticity diagram.

The middle of FIG. 3A and FIG. 3B depicts dependent variables Cx and Cy for the cases in which the thickness dimension of the wavelength conversion unit is 100 μm (line A), 65 μm (line B), and 45 μm (line C). The data plotted in FIGS. 3A and 3A is based on the ratio of the amount of phosphor included in the wavelength conversion unit being uniform.

As shown in FIG. 3A and FIG. 3B, for longer wavelengths, the X coordinate values Cx and the Y coordinate value Cy are both lower. As can be seen, for the wavelengths depicted, a variation in wavelength of the light emitted by the light-emitting unit 2 is accompanied by a variation in the chromaticity as well.

Also, if the thickness dimension of the wavelength conversion unit 8 is reduced, the X coordinate value Cx and the Y coordinate value Cy in the chromaticity diagram both experience a corresponding reduction. This is understood to mean that if the amount of phosphor included in the wavelength conversion unit 8 is lowered, it is possible to reduce the X coordinate value Cx and the Y coordinate value Cy in the chromaticity diagram. More precisely, if the amount of phosphor included in the wavelength conversion unit 8, which is based on the wavelength of the light emitted by light-emitting unit 2, is controlled, it is possible to suppress variations in chromaticity.

For example, by referring to A, B and C in FIG. 3A and FIG. 3B, if the amount of phosphor included in the wavelength conversion unit 8, which emits light with short wavelengths (left side of the figure), is reduced to lower the values Cx and Cy, the reduction can be used to minimize the variation in the values Cx and Cy occurring across the light-emitting unit 2, which also emits light with long wavelengths (right side of the figure).

Therefore, in the wavelength conversion unit 8, it is possible to reduce the variations in chromaticity by providing the distribution of the amount of phosphor so that the amount of phosphor where short-wavelength light is emitted will be less than the amount of phosphor where long-wavelength light is emitted.

For example, like the wavelength conversion unit 8 shown in FIG. 1, the distribution of the amount of phosphor is provided by changing varying the thickness dimension based on the wavelength of light emitted from the light-emitting unit 2 which then can enable the variation in chromaticity to be reduced. Thus, the distribution amount of phosphor is greater in thicker regions of the wavelength conversion unit 8, as well as decreased in thinner regions of the wavelength conversion unit 8, which provides a correlation between the amount of phosphor and the thickness of the wavelength conversion unit 8.

The ΔCx chromaticity difference refers to the difference between the value Cx on the short wavelength side and the value Cx on the long wavelength side. The ΔCy chromaticity difference refers to the difference between the value Cy on the short wavelength side and the value Cy on the long wavelength side. In this embodiment, it is possible to determine and set the amount of phosphor in such a way that the ΔCx chromaticity difference and the ΔCy chromaticity difference are each about 0.015, or less.

Note that if the amount of phosphor is changed, the ΔCx chromaticity difference and the ΔCy chromaticity difference will both change. Also, it is possible to select an amount of phosphor to alter either the ΔCx chromaticity difference or the ΔCy chromaticity difference so that it is about 0.015, or less.

In this case, it is beneficial to have the ΔCx chromaticity difference and the ΔCy chromaticity difference associated with at least two adjacent light-emitting units 2 set at about 0.015, or less. When multiple light-emitting units 2 are provided, it is good to target areas in such a way that the ΔCx chromaticity difference and the ΔCy chromaticity difference for each of the areas are about 0.015. In this way, the amount of phosphor may be determined for each targeted area.

By doing this, the wavelength conversion unit 8 has a varied amount of phosphor that is determined at each position by the thickness dimension at the position.

This kind of wavelength conversion unit 8 is formed by removing portions of the surface of the wavelength conversion unit 8 at various positions based on the characteristics of the light emitted from the light-emitting unit 2 at that position (for example, the wavelength of the light emitted from the light-emitting unit 2). Applying different amounts of resin mixed with the phosphor at different positions may be an alternative way to achieve the same result.

A transparent resin part 9 is provided on top of the wavelength conversion unit 8 with a varied thickness at different positions. The thickness is determined based on the thickness dimension of the wavelength conversion unit 8. To explain in more detail, where the thickness dimension of the wavelength conversion unit 8 is reduced, additional transparent resin part 9 is provided, and, conversely, there is less transparent resin provided where thickness of the conversion unit is increased.

Using such a configuration, there may be a combined thickness dimension T of the wavelength conversion unit 8 together with the transparent resin 9 which is uniform at all positions over the main surface M1. Thus, the upper surface of the transparent resin part 9 is provided with a substantially planar, smooth surface.

According to this manner of manufacture, which provides a substantially uniform thickness dimension T of the wavelength conversion unit 8 together with the transparent resin 9, the space where air can enter is reduced. This may alleviate air entry problems which occur during, for example, pick up by a semiconductor device chip mounter, or other similar device. Thus, it becomes possible to carry out the adsorption and the pick up more reliably, and the yield can then be improved.

In addition, due to the fact that there is a uniform combined thickness T of the wavelength conversion unit 8 together with the transparent resin 9, the pick-up surface of the semiconductor light-emitting device 1 is a substantially planar rather than an irregular surface. Therefore, there is no need to determine a pick-up position based on the thickness dimension of the wavelength conversion unit 8. For this reason, an increase in production efficiency can be attained.

Next, the transparent resin part 9 is provided to include at least a higher value in modulus of elasticity and/or a higher Shore hardness value, as compared to the wavelength conversion unit 8. To be more specific, the transparent resin part 9 may include a modulus of elasticity that is about 150 MPa or more, and/or a Shore D hardness of about 45 or more as compared to the wavelength conversion unit 8. By forming the transparent resin part 9 in this way, the take-backs of light emitting devices 1 due to release failures in the transfer of the semiconductor light-emitting device 1 may be minimized. For example, when the chip mounter is used to transfer the semiconductor light-emitting device 1, and strong adhesive forces are created between the vacuum port(s) of the mounter and the semiconductor light-emitting device 1, the semiconductor light-emitting device 1 is absorbed by the vacuum port(s). Even when the absorption (i.e., suction) of the mounter is stopped, the semiconductor light-emitting device 1 continues to adhere, which may cause the semiconductor device 1 to be retained on the mounter and returned back to the pick-up position.

The cause of release failures is attributable to the modulus of elasticity and/or the hardness of the transparent resin part 9, which is absorbed by the mounter. This often occurs when the modulus of elasticity is less than 150 MPa and the Shore D hardness is less than 45. Because the modulus of elasticity is at least 150 MPa and the Shore D hardness is 45 or more in the embodiment, such release failures may be prevented.

Next, in another aspect, the resin used in the transparent resin part 9 is provided to have a lower refractive index than the refractive index of the wavelength conversion unit 8. When the resin which forms the transparent resin part 9 has a lower refractive index than the refractive index of the wavelength conversion unit 8, the resin is more likely to lower the difference in refractive index in the semiconductor light-emitting device 1 as opposed the difference in the refractive index when the transparent resin part 9 is not utilized and the wavelength conversion unit 8 is exposed to air. However, providing the transparent resin part 9 having a lower refractive index than the refractive index of the wavelength conversion unit 8 makes it possible to improve the light extraction efficiency of the semiconductor light-emitting device 1.

In this case, if the brightness is high and the wavelength is short (e.g., wavelengths from blue light to ultraviolet), the light emitted by the light-emitting unit 2 may degrade the resin in the wavelength conversion unit 8. Therefore, the resin of the wavelength conversion unit 8 from may be formed of materials that prevent such degradation due to blue light etc.

Example resins that prevent the degradation due to blue light include phenyl methyl silicone, dimethyl silicone and a hybrid resin comprising phenyl methyl silicone and epoxy resin, etc. However, other appropriate resins may alternatively be used in accordance with this disclosure. Fortunately, using such a resin does not only prevent the degradation caused by the light emitted by the light-emitting unit 2, it also provides a protective film to prevent the degradation or discoloration of the surfaces of the wavelength conversion layer 8 due to external factors.

Now, the manufacturing method of the semiconductor device of this embodiment will be described. FIGS. 4A to 4E and FIGS. 5A to 5D are cross-sectional views which illustrate stages of the process associated with the manufacturing method of the semiconductor light-emitting device of this embodiment. Note that FIGS. 5A to 5D are a process cross-sectional views corresponding to steps occurring after the steps shown in FIGS. 4A to 4E.

Figure 4A:
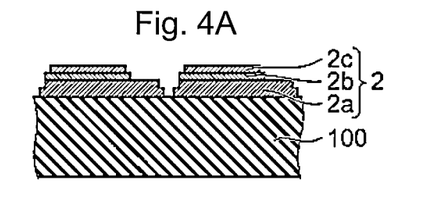
FIGS. 4A to 4E are schematic cross-sectional diagrams illustrating steps of the manufacturing method of the semiconductor light-emitting device according to one embodiment.

First, as shown in FIG. 4A, on top of a substrate 100 made of sapphire, silicon, etc., the semiconductor part 2a, the active part 2b, and the semiconductor part 2c are formed in this order (step S1). The result of these steps is the formation, on top of the substrate 100, of a plurality of light-emitting units 2.

In this case, it is possible to deposit these components by using a well-known sputtering technique or vapor phase epitaxy technique. Examples of vapor phase epitaxy techniques which may be used include Metal Organic Chemical Vapor Deposition technique (MOCVD), Hydride Vapor Phase Epitaxy technique (HYPE), and Molecular beam epitaxy (MBE) techniques.

Next, the shapes of the semiconductor part 2a, the active part 2b, and the semiconductor part 2c can be formed by using well-known techniques such as the lithography technique or etching technique, etc.

Figure 4B:
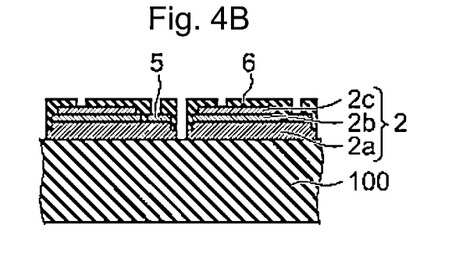

The next step is, as shown in FIG. 4B, to form the junction 5 and the insulating part 6 (step S2). In this case, the junction 5 and the insulating part 6 can be formed by one or a combination of techniques, such as PVD (Physical Vapor Deposition) techniques like the vacuum deposition method, the sputtering technique, various CVD (Chemical Vapor Deposition) techniques, the lithography technique, the etching technique, etc.

Figure 4C:
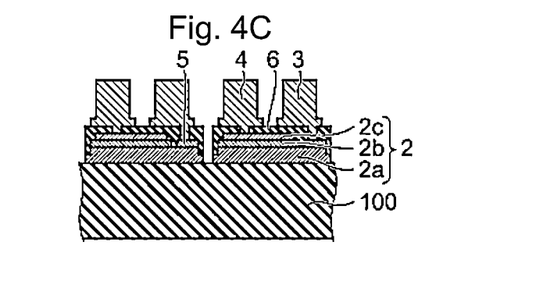

The next step is, as shown in FIG. 4C, to form the electrode part 3 and the electrode part 4 (step S3) In this case, the electrode part 3 and the electrode part 4 can be formed by one or a combination of techniques, for example, PVD techniques such as vacuum deposition method, the sputtering technique, various CVD techniques, the lithography technique, the etching technique, etc.

Figure 4D:
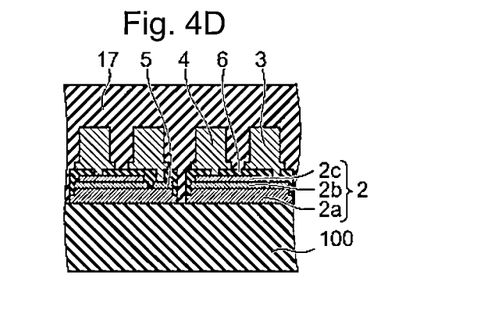

The next step is, as shown in FIG. 4D, to form a layer 17 which will become the sealing part 7 (step S4). In this case, the layer 17 which will become the sealing part 7 can be formed by one or a combination of techniques which may include, for example, PVD techniques such as the vacuum deposition method, the sputtering technique, various CVD techniques, the lithography technique or the etching technique, etc.

Figure 4E:
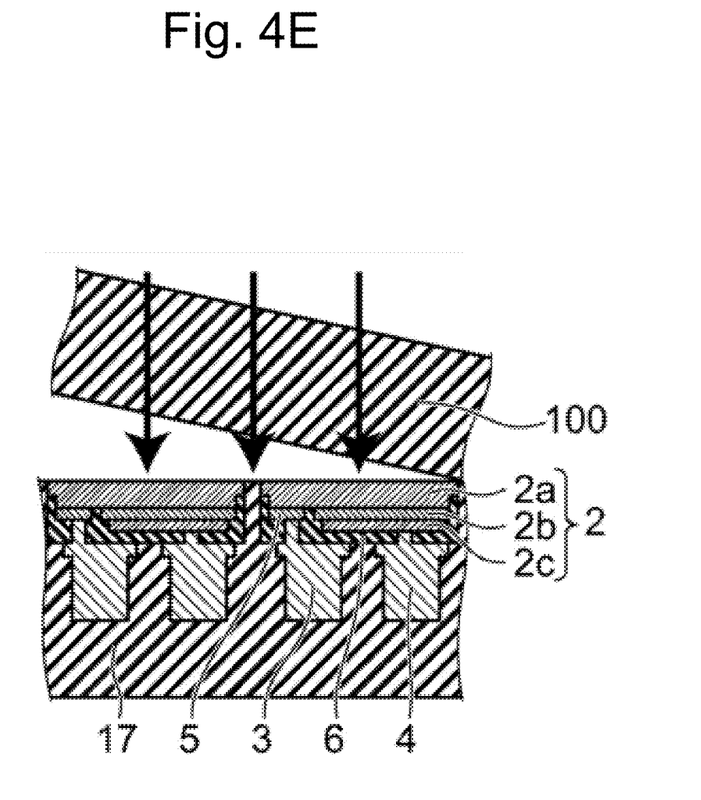

The next step is, as shown in FIG. 4E, to delaminate the substrate 100 from the formed structure. In this manner, substrate 100 is detached and discarded (step S5). If sapphire etc. is used for the substrate 100, it is possible to peel off the laminate from the substrate 100 by using a laser removal technique, etc. If silicon is used for the substrate 100, laminate may be peeled off from the substrate 100 by using an etching technique, etc. It should be noted that FIG. 4E shows the case in which the structure is inverted before it is peeled off.

Figure 5A:
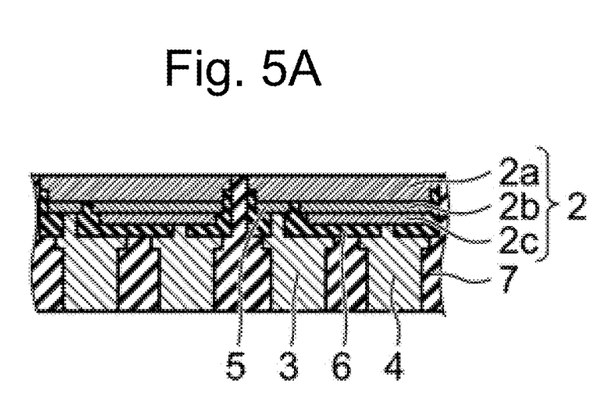
FIGS. 5A to 5D are cross-sectional diagrams illustrating steps of the processing method of the semiconductor light-emitting device of FIGS. 4A-4E.

The next step is, as shown in FIG. 5A, to polish the surface of the layer 17 in order to expose the electrode 3 and the electrode 4 (step S6). By polishing in this manner, the sealing part 7 is formed.

The next step is to determine the wavelength of the light emitted by the light-emitting unit 2 for each light-emitting unit 2 formed thereon (step S7).

Then, the distribution of the amount of phosphor for the various positions of the wavelength component unit 8 are calculated based on the wavelengths of the light that has been measured at each location (step S8). In this case, as illustrated in FIG. 2 and FIGS. 3A and 3B, the correlations between the variation in light wavelength, amount of phosphor, or chromaticity can be obtained in advance by experiments or simulations, and it is possible to calculate the distribution of the amount of phosphor based on these correlations.

The wavelength conversion unit 8 is then formed based on the distribution amounts of phosphor that have been calculated (step S9) in step S8.

Figure 5B:
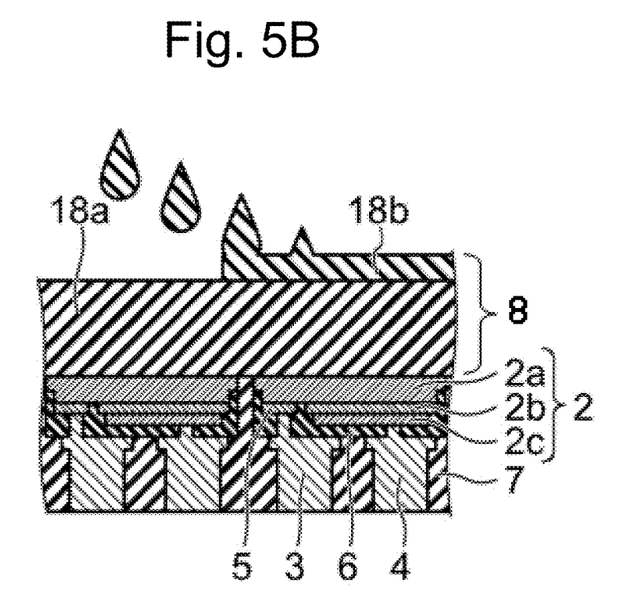

In one example, as shown in FIG. 5B, a first wavelength conversion layer 18a is formed on the entire main surface M1 of the light-emitting unit 2 and a second wavelength conversion layer 18b is individually formed based on the amount of phosphor that has been obtained. More precisely, based on the distribution of the amount of phosphor that has been obtained on the main surface M1 of the light-emitting unit 2, the wavelength conversion unit 8 is individually formed by applying one or more layers of the resin which has been mixed with phosphor.

Figure 5C:
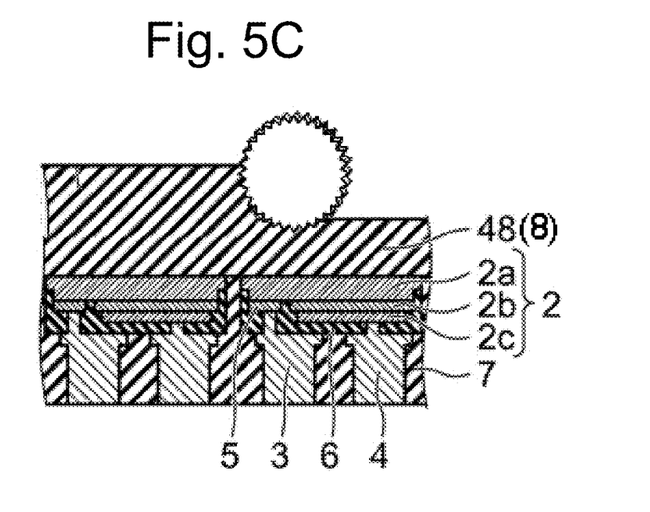

FIG. 5C depicts the formation of the wavelength conversion unit 8 using a step that is an alternative to the example shown in FIG. 5B. As can be seen in FIG. 5C, a wavelength conversion layer 48 is formed on the entire main surface M1 of the light-emitting unit 2, and the thickness dimension of the wavelength conversion layer 48 is varied at different locations based on the amounts of phosphor that have been determined for each location. More precisely, on the entire main surface M1 of the light-emitting unit 2, the wavelength conversion unit 8 is formed by applying the resin which has been mixed with phosphor, and the thickness dimension of the wavelength conversion layer 48 is varied based on the amount of phosphor required at each location. Where less phosphor is required at a position because of the emitted wavelengths, the thickness is increased. In addition, the wavelength conversion unit 8 can also be formed by a combination of the two techniques described in FIG. 5B and FIG. 5C.

In the step in which the wavelength conversion layer 48 is formed on the entire main surface M1 of the light-emitting unit 2, coating methods such as the squeegee printing method, compression molding method, imprinting method, dispensing method, inkjet method, and aerosol method can be used to deposit the resin.

In the cases where the wavelength conversion layer 48 is individually formed on a plurality of portions on the structure, coating methods such as the dispensing method, inkjet method, and aerosol method can be used.

In order to change the thickness dimension of the wavelength conversion unit, as shown in FIG. 4C, it is possible to selectively remove the deposited resin using a polishing device 101 (e.g., a grindstone).

Figure 6A:
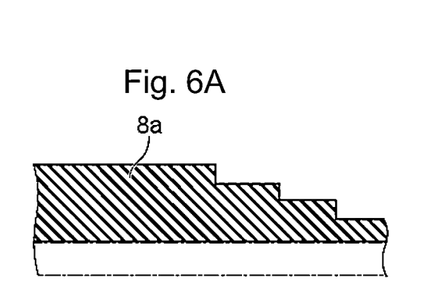
FIGS. 6A to 6D are cross-sectional diagrams showing various embodiments of the wavelength conversion unit.
Figure 6B:
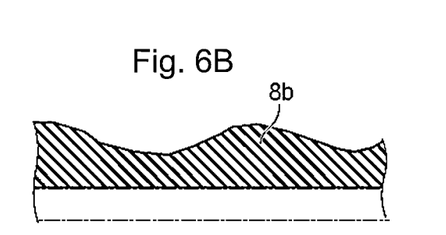
Figure 6C:
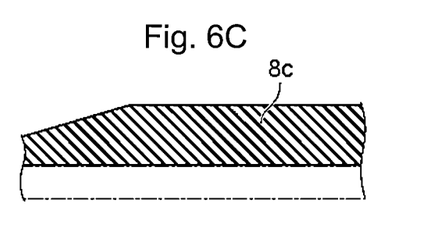
Figure 6D:
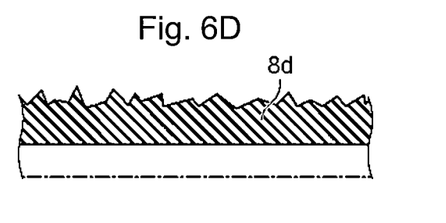

FIGS. 6A to 6D are schematic cross-sectional views illustrating the structure of the wavelength conversion unit after being formed using the previously-described fabrication methods. As shown in FIG. 6A, the surface of a variable thickness wavelength conversion layer 8a can be processed so as to have a staircase shape. As shown in FIG. 6B, the surface of a variable thickness wavelength conversion layer 8b can be formed so as to have a curved shape. As shown in FIG. 6C, the surface of a variable thickness wavelength conversion layer 8c can be formed as a slope. As shown in FIG. 6D, the surface of a variable thickness wavelength conversion layer 8d can be formed so that the surface is irregular with high aspect ratios.

It should be noted that the surface shape of the wavelength conversion unit is not limited to the patterns illustrated, and other appropriate shapes are possible.

After forming the wavelength conversion unit 8, the next step is to determine the variations in chromaticity of each light-emitting unit 2. These measurements are taken to reveal the areas of the wavelength conversion unit that continue to demonstrate undesirable variations in chromaticity so that the variations may be eliminated through further adjustments. In order to eliminate the variations, techniques may be used which include selectively applying resin mixed with phosphor at specific areas, or selectively thinning the thickness dimension of the wavelength conversion unit at necessary areas. Also, if needed, a solder bump can be formed on the edges of the electrode part 3 and the electrode part 4 at this stage.

Figure 5D:
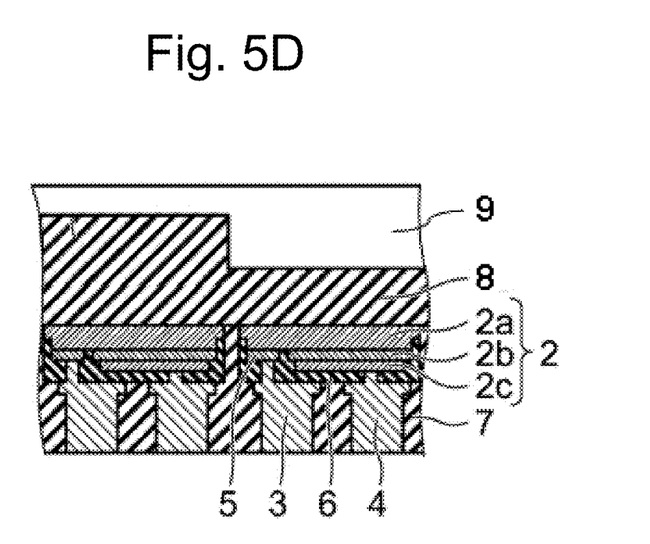

Referring to FIG. 5D, the next step is to form the transparent resin 9 depending on the varying thicknesses of the wavelength conversion unit 8 (step S10). In this case, as shown in FIG. 5D, a greater amount of the transparent resin 9 is applied where the thickness of the wavelength conversion unit 8 is thinner, and a smaller amount of the transparent resin 9 is applied where the thickness of the wavelength conversion unit 8 is thicker. In this manner, it is possible to have a substantially uniform thickness dimension of the wavelength conversion unit 8 and the transparent resin 9.

It is possible to use coating methods such as the spin coating method, printing squeegee method, compression molding, imprinting method, dispensing method, inkjet method, aerosol method, etc to apply the transparent resin.

Next, a division is performed, if necessary, to subdivide the structure into single light emitting units 2 or a structure(s) having multiple light emitting units 2. By division, the semiconductor device may have one part of the light-emitting unit 2 or it may also have multiple light-emitting units 2. In this case, it is possible to carry out the division by using the blade dicing technique or other appropriate dicing techniques.

To summarize, according to this embodiment, a light-emitting unit 2, which emits light, and a wavelength conversion unit 8, which is provided on a main surface of the light-emitting unit 2, are provided. The wavelength conversion unit 8 includes phosphor, and a transparent resin 9 is provided on the wavelength conversion unit 8 so as to have a varied thickness which is dependent on the thickness dimension of the wavelength conversion unit 8. Also, the transparent resin 9 is formed in such a way as to have a greater modulus in elasticity and/or a greater Shore hardness than the wavelength conversion unit 8.

Accordingly, when performing chip mounting, for example, upon picking up the semiconductor device, it is possible to reduce the space where air can enter at the adsorption surfaces. Thus, the adsorption process may be more reliable. In this way, the yield can be improved. In addition, when mounting the semiconductor device, it is possible to improve yield by minimizing the occurrence of release failures.

In addition, because the combined thickness of the wavelength conversion unit 8 together with the transparent resin 9 is substantially uniform, it is possible have a planar, smooth and large surface area available as a pick-up surface for the semiconductor light-emitting device. Because of this, there is no need to determine a particular pick-up position according to a thickness dimension, which also facilitates improved production efficiency.

Additionally, according to the embodiment, the transparent resin 9 uses materials with a smaller refractive index than the wavelength conversion unit 8.

This makes it possible to lower the difference between the refractive indices of the structure as compared to the difference between the refractive indices of air and the wavelength conversion unit 8. Thus, the light extraction efficiency can be improved.

It should be noted that while the multi-chip type of the semiconductor light-emitting device, which includes multiple light-emitting units, has been illustrated herein, this disclosure is also applicable to semiconductor light-emitting devices which have only one light-emitting unit.

In this embodiment, the wavelength conversion unit 8 is formed on the light-emitting unit 2, but it is also beneficial to provide an adhesive layer that allows light transmission between the light-emitting unit 2 between the light-emitting unit 2, which emits the light, and the wavelength conversion unit 8. Because of this, blue light emitted by the light emitting unit 2 from the adhesive layer is transmitted. Also, in the cases where yellow phosphor is used, the formation of a yellow ring can be suppressed and it becomes possible to have substantially uniform white light.

Inorganic materials used to form the adhesive layer may include various oxides such as glass, quartz, and aluminum oxide, various nitrides such as silicon nitride, and various fluorides such as magnesium fluoride. Alternatively, organic materials which may be used to form the adhesive layer include acrylic, epoxy, polycarbonate, polypropylene, polyethylene, silicon resin, etc. It should be noted that when inorganic materials are used, it is possible to improve the adhesion between the light-emitting unit 2 and the wavelength conversion unit 8.

The adhesive layer is provided to include a refractive index that is between the refractive index of the light-emitting unit 2 and the wavelength conversion unit 8. In this way, it is possible to improve the light extraction efficiency. More precisely, by configuring the adhesive layer so as to have such a refractive index, it is possible to avoid total reflection of the light emitted by the light-emitting unit 2 on the light extraction surface of the light-emitting unit 2. As a result, the retrieving efficiency of the light emitted by the light-emitting unit 2 can be improved.

While certain embodiments have been described, these embodiments have been presented by way of example only, and are not intended to limit the scope of the invention. Indeed, the novel embodiments described herein may be embodied in a variety of other forms; furthermore, various omissions, substitutions, and changes in the form of the embodiments described herein may be made without departing from the spirit of the invention. The accompanying claims and their equivalents are intended to cover such forms or modifications as would fall within the scope and spirit of the invention.

What is claimed is:

1. A semiconductor light-emitting device, comprising:
a plurality of light-emitting units which emit light and include first and second light-emitting units;
a wavelength conversion unit which includes a phosphor and which is continuously provided on light-emitting surfaces of the plurality of light-emitting units, the wavelength conversion unit including a first region disposed on the first light-emitting unit and a second region disposed on the second light-emitting unit, the first and second regions having different thicknesses; and
a transparent resin which is continuously provided on top of the wavelength conversion unit and includes a third region disposed on top of the first region and a fourth region disposed on top of the second region, the third and fourth regions having different thicknesses, wherein:
a total thickness of the first region and the third region is equal to a total thickness of the second region and the fourth region, and
the transparent resin has a Shore hardness greater than a Shore hardness of the wavelength conversion unit.

2. The semiconductor light-emitting device of claim 1, wherein the transparent resin has a Shore hardness of more than 45.

3. The semiconductor light-emitting device of claim 1, wherein an amount of phosphor in the first region of the wavelength conversion unit is greater than an amount of phosphor in the second region of the wavelength conversion unit.

4. The semiconductor light-emitting device of claim 1, wherein the transparent resin has a refractive index lower than a refractive index of the wavelength conversion unit.

5. A semiconductor light-emitting device, comprising:
a plurality of light-emitting units which emit light and include first and second light-emitting units;
a phosphor-containing wavelength conversion unit continuously disposed on surfaces of the plurality of light-emitting units; and
a transparent resin which is continuously provided on top of the wavelength conversion unit, the transparent resin having a first region having a first thickness and disposed above the first light-emitting unit and a second region having a second thickness that is different from the first thickness and disposed above the second light-emitting unit, such that an upper surface of the transparent resin is even, wherein the transparent resin has a refractive index lower than a refractive index of the wavelength conversion unit.

6. The semiconductor light-emitting device of claim 5, wherein the transparent resin has a modulus of elasticity greater than a modulus of elasticity of the wavelength conversion unit.

7. The semiconductor light-emitting device of claim 5, wherein the transparent resin has a Shore hardness greater than a Shore hardness of the wavelength conversion unit.

8. The semiconductor light-emitting device of claim 5, wherein the wavelength conversion unit has a third region disposed on the first light-emitting unit and a fourth region disposed on the second light-emitting unit, and a total thickness of the first region and the third region is equal to a total thickness of the second region and the fourth region.

* * * * *